(12) United States Patent
Coutu

(10) Patent No.: US 6,897,706 B2
(45) Date of Patent: May 24, 2005

(54) METHOD FOR DRIVING A HIGH SIDE P-CHANNEL MOSFET

(75) Inventor: David Coutu, East Hampton, CT (US)

(73) Assignee: IMP Inc., Plainville, CT (US)

( * ) Notice: Subject to any disclaimer, the term of this patent is extended or adjusted under 35 U.S.C. 154(b) by 0 days.

(21) Appl. No.: 10/364,843

(22) Filed: Feb. 13, 2003

(65) Prior Publication Data

US 2004/0160266 A1 Aug. 19, 2004

(51) Int. Cl.$^7$ .............................................. H03K 17/56
(52) U.S. Cl. ........................ 327/423; 327/424; 327/427
(58) Field of Search ................................. 327/423, 424, 327/425, 427, 430, 112, 494; 330/176, 181, 140; 318/599; 360/46

(56) References Cited

U.S. PATENT DOCUMENTS 4,639,653 A * 1/1987 Anderson et al. ........... 318/599
4,669,004 A * 5/1987 Moon et al. .................. 360/53
6,512,645 B1 * 1/2003 Patti et al. .................... 360/46
6,611,157 B2 * 8/2003 Usui .......................... 327/112

* cited by examiner

Primary Examiner—Tuan T. Lam
Assistant Examiner—Hiep Nguyen

(57) ABSTRACT

A P-CHANNEL MOSFET is configured as a high side switch by arranging a capacitor between the P-CHANNEL MOSFET gate and a pair of push/pull transistors in a control circuit. A pull-up resistor is connected with the high side supply, one leg of the capacitor and with the gate of the P-CHANNEL MOSFET. In a two-phase electrical drive circuit, a pair of P-CHANNEL MOSFETS is connected with the high side supply and a pair of N-CHANNEL MOSFETS is connected with the low side supply.

17 Claims, 2 Drawing Sheets

METHOD FOR DRIVING A HIGH SIDE P-CHANNEL MOSFET

BACKGROUND OF THE INVENTION

The use of MOSFET type semiconductors to turn on electric devices, such as stepper motors and the like is described, for example, in U.S. Pat. No. 4,924,158 entitled "Motor Driver Protection Circuit".

An application of such MOSFET devices for selective speed motor operation is found in U.S. Pat. No. 6,066,834 entitled "Speed Control Device for DC Motors".

A further application of MOSFET devices for over current protection is described within U.S. Pat. No. 5,550,701 entitled "Power MOSFET with Over current and Over-Temperature Protection and Control Circuit Decoupled From Body Diode".

When MOSFET devices are used in the continuous operation of such electrical devices, an N-CHANNEL MOSFET is usually employed due to the lower gate resistance of the N-CHANNEL MOSFET compared to a P-CHANNEL MOSFET. The use of such N-CHANNEL MOSFETS, however, requires additional circuitry to drive their gates above the high side supply.

A further deterrent to the use of the P-CHANNEL MOSFETS is the need for a level-shifting circuit component to insure that the source voltage does not exceed the gate voltage to prevent damage to the P-CHANNEL MOSFET.

One purpose of the instant invention is to provide a low-cost shifting circuit to maintain the gate of a P-CHANNEL MOSFET at a voltage less than maximum gate voltage to prevent damage to the P-CHANNEL MOSFET at a minimum increase in component cost. A further purpose is to provide high speed switching with minimum current draw.

A further purpose of the Invention is to incorporate both P-CHANNEL MOSFETs and N-CHANNEL MOSFETs advantageously within a solid state control circuit for operating electrical devices such as electric motors and the like.

SUMMARY OF THE INVENTION

A P-CHANNEL MOSFET is configured as a high side switch by arranging a capacitor between the P-CHANNEL MOSFET gate and a pair of push/pull transistors in a control circuit. A pull-up resistor is connected with the high side supply, one leg of the capacitor and with the gate of the P-CHANNEL MOSFET. During start-up operation, the resistor charges the capacitor and the gate of the P-CHANNEL MOSFET to the supply voltage level to first initialize the circuit. To complete circuit initialization, voltage is applied to the source of upper transistor of the push/pull transistors and to the other leg of the capacitor. During circuit operation, the capacitor functions as a level-shifting device to provide continuous operating voltage to the P-CHANNEL MOSFET as well as to protect the P-CHANNEL MOSFET from over-voltage damage. In a two-phase electrical drive circuit, a pair of P-CHANNEL MOSFETS is connected with the high side supply and a pair of N-CHANNEL MOSFETS is connected with the low side supply.

DESCRIPTION OF THE PREFERRED EMBODIMENT

Before depicting the power control circuit of the invention, it is helpful to describe a portion of a power control circuit according to the Prior Art.

Figure 1:
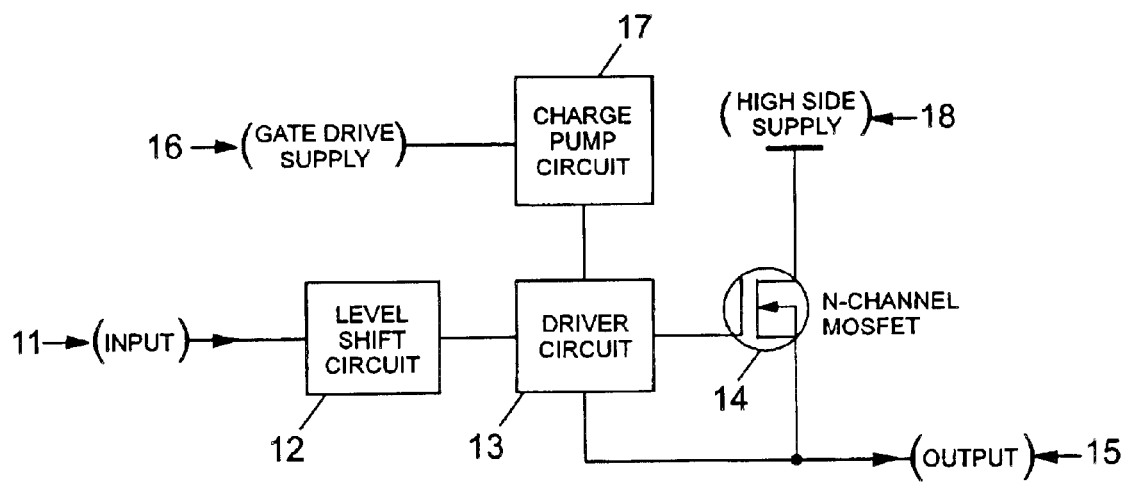
FIG. 1 is a diagrammatic representation of a connection between a high side supply source and an N-CHANNEL MOSFET in accordance with the Prior Art.

One phase of a known solid state control circuit 10 is depicted in FIG. 1 to show the requirement of a level shift circuit 12 and driver circuit 13 intermediate an N-CHANNEL MOSFET 14, hereafter "NFET", and the input 11. A charge pump circuit 17 is arranged intermediate the gate drive supply 16 and the driver circuit 13 and the drain of the NFET connects with the high side supply 18. The charge pump circuit can comprise an IR2MGD, for example. The level shift circuit 12 and driver circuit 13 can be combined within a single element type M16C/62 from Mitsubishi. The output 15 can be connected with a two-phase electrical device, such as a motor, whereby a pair of NFETs 14, level shift circuits 12, driver circuits 13, and charge pump circuits 17 are required for each resulting in 4 NFETs, 4 level shift circuits, 4 driver circuits, and 4 charge pump circuits with each electrical device employed.

Figure 2:
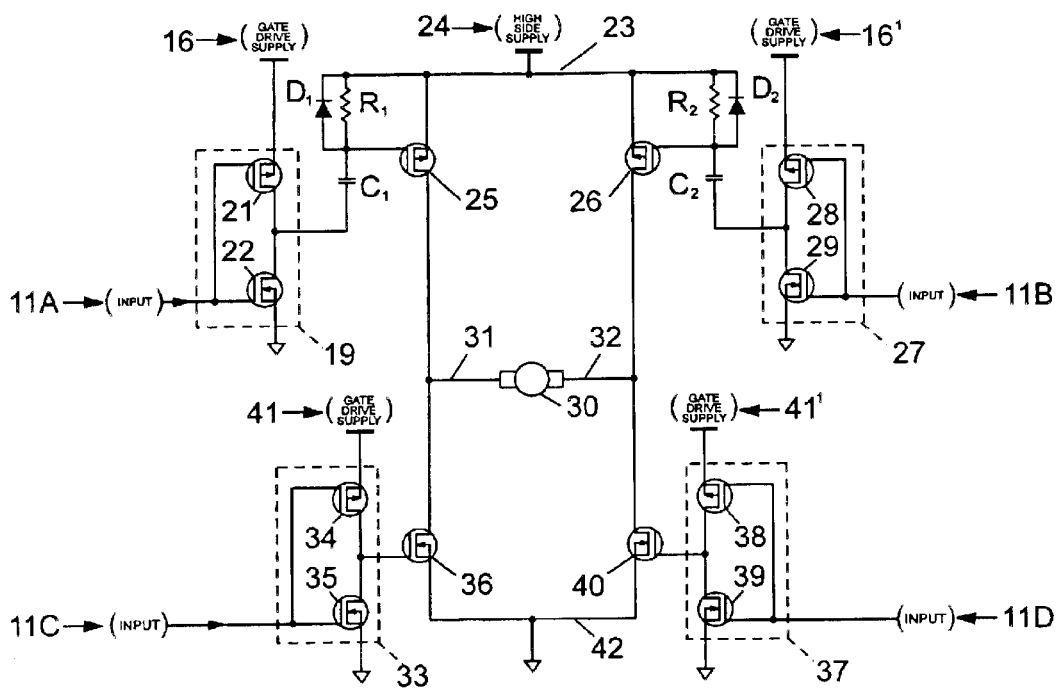
FIG. 2 is a diagrammatic representation of a motor control circuit employing N-CHANNEL and P-CHANNEL MOSFETS according to the invention.

In accordance with the teachings of the Invention, a pair of P-CHANNEL MOSFETs, hereafter "PFETs" 25, 26 and a pair of NFETs 36, 40 are employed within the solid-state control circuit 20 best seen in FIG. 2. The PFETs are connected with the high side supply rail 23 and the NFETs are connected with the low side supply rail 42 to optimize the gate resistance differences between the PFET and NFET devices.

The input depicted at 11A connects with the first push/pull transistor pair 19 via the gates of transistors 21,22. The source of transistor 21 connects with the gate drive supply 16 and the source of transistor 22 connects with ground. The collectors of transistors 21, 22 connect with the base of the first PFET 25 through the capacitor C1 that connects with high side supply rail 23 via a first resistor R1 and first diode D1. The high side supply rail connects with the high side voltage supply as indicated at 24. The functional interconnection between the transistor pair 19, capacitor C1, resistor R1, diode D1 and PFET 25 is an important feature of the invention, and will be discussed below in greater detail.

The input depicted at 11B connects with the second push/pull transistor pair 27 via the gates of transistors 28,29. The source of transistor 28 connects with the gate drive supply 16' and the source of transistor 29 connects with ground. The drains of transistors 28, 29 connect with the gate of the second PFET 26 through the capacitor C2 that connects with high side supply rail 23 via a second resistor R2 and second diode D2. The source of the first PFET 25 connects with the high side rail 23 and the drain of the first PFET connects with one side of the motor 30, via conductor 31. The source of the second PFET 26 connects with the high side rail 23 and the drain of the second PFET connects with one side of the motor 30, via conductor 32 to complete the high side connection.

The input depicted at 11C connects with the third push/pull transistor pair 33 via the gates of transistors 34,35. The source of transistor 34 connects with the gate drive supply 41 and the source of transistor 33 connects with ground. The drains of transistors 34,35 connect with the gate of the first NFET 36. The drain of NFET 36 connects with one side of the motor 30 via conductor 31 and the source of NFET 36 connects with the low side supply rail 42.

The input depicted at 11D connects with the fourth push/pull transistor pair 37 via the gates of transistors 38,39. The source of transistor 38 connects with the gate drive supply 41' and the source of transistor 39 connects with ground. The drains of transistors 38,39 connect with the gate of the second NFET 40. The drain of NFET 40 connects with one side of the motor 30 via conductor 32.

The operation of the solid-state control circuit 20 of FIG. 2 is best seen as follows.

The capacitors C1, C2 are used as level shifting devices and the pull-up resistors R1, R2 are used to charge the capacitors and the gates of the PFETs 25, 26 to the high side supply voltage for initialization. To further initialize the circuit, the upper transistors 21, 28 of the push/pull transistor pairs 19, 27 respectively, should be on, connecting the opposite sides of the capacitors C1, C2 to the required voltage necessary to turn on the PFETs. This sequence of events is not important to insure proper operation of the PFETs upon initialization. Either the high side supply 24 or the gate drive supply 16, 16' can be turned on first. In the event the lower transistors 22, 29 of the push/pull transistor pairs 19, 27 are turned on before the high side supply, the upper transistors 21, 28 are switched on, charging the capacitors C1, C2 to the gate drive voltage, before the PFETs can be turned on.

With the upper transistors 21, 28 of the push/pull pairs 19,27 turned on, the upper legs of the capacitors C1, C2 are at the high side supply and the lower legs of the capacitors are at the gate drive voltage. Since the gates of the PFETs 25, 26, connected to the upper legs of the capacitors, are also at the potential of the high side supply, the PFETs are turned off. With the upper transistors 21, 28 of the push/pull pairs 19, 27 turned off and the lower transistors 22, 29 turned on, the lower legs of the capacitors become quickly connected to ground to thereby cause the voltage on the upper legs of the capacitors to drop to the gate drive voltage. The gate charge will be absorbed into the capacitor and the gate voltage will drop by the magnitude of the gate supply voltage. With the gates of the PFETs 25, 26 now below the high side supply voltage by the magnitude of the gate drive voltage, the PFETs turn on.

The PFETs can be turned off in two ways. Upon occurrence of a circuit overload, for example, the lower transistors 22, 29, of the push/pull transistor pairs 19, 27 become turned off and the upper transistors 21, 28 become turned on. When this occurs, the bottom legs of the capacitors C1, C2 are driven to the gate supply voltage, which forces the upper legs of the capacitors and the gates of the PFETs to increase by the gate drive voltage. Any additional voltage that may have occurred by absorbing the gate charge of the PFETs, or charging due to the pull-up resistors R1, R2, is channeled through the clamping diode D1 to the high side supply.

The second method of turning off the PFETs 25, 26 is by allowing the top legs of the capacitors C1, C2 to charge to the level of the high side supply via the pull-up resistors R1, R2 that connect the upper legs of the capacitors to the high side supply. When this method is employed, the PFETs are first switched on then switched off via the push/pull transistor pairs 19, 27 to enable the PFETs to switch back on.

When MOSFET transistors are employed as the push/pull transistor pairs 19, 27 for example, the only energy required to switch the PFETs is the initial energy to charge the capacitors C1, C2 and the resistive loses in the wiring and transistors to thereby provide a cost efficient design. Switching frequency is only limited by the PFETs employed and the speed of the push/pull transistor pairs.

What is claimed is:

1. A method of configuring a pair of P-CHANNEL MOSFETS as a high side switch comprising the steps of:
   connecting a first P-CHANNEL MOSFET intermediate a high side supply rail and a first input to an electrical device;
   interconnecting a first pull-up resistor between a gate of said first P-CHANNEL MOSFET and said high side supply rail;
   interconnecting a first capacitor between said first P-CHANNEL MOSFET gate and a first pair of push/pull transistors; and
   interconnecting a first diode between said first P-CHANNEL MOSFET gate and said high side supply rail;
   connecting a second P-CHANNEL MOSFET intermediate said high side supply rail and a second input to said electrical device;
   interconnecting a second pull-up resistor between said second P-CHANNEL MOSFET gate and said high side supply rail;
   interconnecting a second capacitor between said second P-CHANNEL MOSFET gate and a second pair of push/pull transistors, whereby said first and second capacitors function as level-shifting devices to provide continuous operating voltage to said first and second P-CHANNEL MOSFET's and to protect said first and second P-CHANNEL MOSFET's from over-voltage damage; and
   interconnecting a second diode between said second P-CHANNEL MOSFET gate and said high side supply rail.

2. The method of claim 1 wherein a source of one of said first pair of push/pull transistors connects with a supply voltage and a source of another of said first pair of push/pull transistors connects with a ground rail.

3. The method of claim 2 wherein a source of one of said second pair of push/pull transistors connects with said supply voltage and a source of another of said second pair of push/pull transistors connects with said ground rail.

4. The method of claim 1 including the steps of: connecting a first N-CHANNEL MOSFET between said ground rail and said first input to said electrical device; and connecting a gate of said first N-CHANNEL MOSFET with a third pair of push/pull transistors.

5. The method of claim 4 including the steps of connecting a second N-CHANNEL MOSFET between said ground rail and said second input to said electrical device; and connecting a gate of said second N-CHANNEL MOSFET with a fourth pair of push/pull transistors.

6. The method of claim 4 wherein a source of one of said third pair of push/pull transistors connects with said supply voltage and a source of another of said third pair of push/pull transistors connects with said ground rail.

7. The method of claim 4 wherein a source of one of said fourth pair of push/pull transistors connects with said supply voltage and a source of another of said fourth pair of push/pull transistors connects with said ground rail.

8. The method of claim 2 wherein a gate of said one of said first pair of push/pull transistors connects with a gate on said other of said first pair of push/pull transistors.

9. The method of claim 3 wherein a gate of one of said second pair of push/pull transistors connects with a gate on said other of said second pair of push/pull transistors.

10. The method of claim 6 wherein a gate of said one of said third pair of push/pull transistors connects with a gate on said other of said third pair of push/pull transistors.

11. The method of claim 7 wherein a gate of one of said fourth pair of push/pull transistors connects with a gate on said other of said fourth pair of push/pull transistors.

12. A solid-state control circuit for operation of an electrical device comprising;
   a first P-CHANNEL MOSFET intermediate a high side supply rail and a first input to an electrical device;
   a first pull-up resistor between a gate of said first P-CHANNEL MOSFET and said high side supply rail;
   a first capacitor interconnecting between said first P-CHANNEL MOSFET gate and
   a first pair of push/pull transistors;
   a first diode between said first P-CHANNEL MOSFET gate and said high side supply rail; and
   a second P-CHANNEL MOSFET intermediate said high side supply rail and a second input to said electrical device;
   a second pull-up resistor between a gate of said second P-CHANNEL MOSFET and said high side supply rail;
   a second capacitor interconnecting between said second P-CHANNEL MOSFET gate and a second pair of push/pull transistors, whereby said first and second capacitors function as level-shifting devices to provide continuous operating voltage to said first and second P-CHANNEL MOSFET's and to protect said first and second P-CHANNEL MOSFET's from over-voltage damage; and
   a second diode between said second P-CHANNEL MOSFET gate and said high side supply rail.

13. The control circuit of claim 12 wherein a drain on said first P-CHANNEL MOSFET connects with said electrical device first input and a source on said first P-CHANNEL MOSFET connects with said high side supply rail.

14. The control circuit of claim 11 wherein said first pair of push/pull transistors comprise one first transistor having one gate and another first transistor having another gate connecting with said one gate and with a first input voltage source.

15. The control circuit of claim 14 wherein said one first transistor further includes one first drain and said other first transistor includes another first drain, said one first drain being connected with said other first drain and with said first P-CHANNEL MOSFET gate.

16. The control circuit of claim 12 including a first N-CHANNEL MOSFET intermediate a ground rail and said first input to said electrical device; and
   a third pair of push/pull transistors connecting with a gate on said first N-CHANNEL MOSFET and with a third voltage input source.

17. The control circuit of claim 16 including a second N-CHANNEL MOSFET intermediate said ground rail and said second input to said electrical device; and
   a fourth pair of push/pull transistors connecting with a gate on said second N-CHANNEL MOSFET and with a fourth voltage input source.

* * * * *